US007482166B2

(12) United States Patent
Nollert et al.

(10) Patent No.: US 7,482,166 B2
(45) Date of Patent: Jan. 27, 2009

(54) METHOD AND APPARATUS FOR PREPARING LIPIDIC MESOPHASE MATERIAL

(75) Inventors: Peter Nollert, San Francisco, CA (US); Lance Stewart, Bainbridge Island, WA (US); Hidong Kim, Bainbridge Island, WA (US)

(73) Assignee: The Regents of the University of California, San Francisco, CA (US)

( * ) Notice: Subject to any disclaimer, the term of this patent is extended or adjusted under 35 U.S.C. 154(b) by 990 days.

(21) Appl. No.: 10/688,010

(22) Filed: Oct. 17, 2003

(65) Prior Publication Data

US 2004/0092034 A1 May 13, 2004

Related U.S. Application Data

(62) Division of application No. 09/908,429, filed on Jul. 18, 2001, now Pat. No. 6,821,487.

(60) Provisional application No. 60/219,016, filed on Jul. 18, 2000.

(51) Int. Cl.
*G01N 33/92* (2006.01)

(52) U.S. Cl. ........................... 436/71; 436/63; 436/174; 436/180; 422/100

(58) Field of Classification Search ................. 422/100; 436/180, 174, 179, 63, 71
See application file for complete search history.

(56) References Cited

U.S. PATENT DOCUMENTS

| | | | |
|---|---|---|---|
| 3,586,064 | A | 6/1971 | Brown et al. |
| 3,734,127 | A | 5/1973 | Williams et al. |
| 3,817,425 | A | 6/1974 | Liston |
| 3,974,832 | A | 8/1976 | Kruck |
| 4,011,658 | A | 3/1977 | Tarrson et al. |
| 4,011,685 | A | 3/1977 | Boyd et al. |
| 4,046,145 | A | 9/1977 | Choksi et al. |
| 4,388,272 | A | 6/1983 | Gesteland |
| 4,390,500 | A | 6/1983 | Miskinis |
| 4,615,468 | A | 10/1986 | Gay |
| 4,743,229 | A | 5/1988 | Chu |
| 4,750,373 | A | 6/1988 | Shapiro |
| 4,803,053 | A | 2/1989 | Williamson |
| 5,006,473 | A | 4/1991 | Bouma et al. |

(Continued)

FOREIGN PATENT DOCUMENTS

DE 3102142 A 8/1982

(Continued)

OTHER PUBLICATIONS

Landau, EM; Rosenbusch, JP, Lipidic Cubic Phases: A Novel Concept for the Crystallization of Membrane Proteins, Proc. Natl. Acad. Sci., vol. 93, pp. 14532-14535, Dec. 1996.

(Continued)

*Primary Examiner*—Brian R. Gordon
(74) *Attorney, Agent, or Firm*—Townsend and Townsend and Crew LLP

(57) ABSTRACT

A coupling system can utilize a first receptacle and a second receptacle to couple syringes together. Syringes can be used to mix viscous material and/or dispense the viscous material. Furthermore, a kit can be provided that contains parts used in mixing and/or dispensing viscous material.

7 Claims, 8 Drawing Sheets

200
300
100

U.S. PATENT DOCUMENTS

| | | | | |
|---|---|---|---|---|
| 5,032,457 | A | 7/1991 | Wallach | |
| 5,063,025 | A | 11/1991 | Ito | |
| 5,147,723 | A | 9/1992 | Wallach | |
| 5,154,930 | A | 10/1992 | Popescu et al. | |
| 5,178,838 | A | 1/1993 | Sala et al. | |
| 5,183,761 | A | 2/1993 | Freeman et al. | |
| 5,219,538 | A | 6/1993 | Henderson et al. | |
| 5,227,139 | A | 7/1993 | Wong | |
| 5,275,953 | A | 1/1994 | Bull | |
| 5,425,920 | A | 6/1995 | Conti et al. | |
| 5,454,268 | A | 10/1995 | Kim | |
| 5,580,530 | A | 12/1996 | Kowatsch et al. | |
| 5,728,821 | A * | 3/1998 | Yelton et al. | 536/23.53 |
| 5,733,572 | A | 3/1998 | Unger et al. | |
| 5,762,877 | A | 6/1998 | Brewer | |
| 5,792,456 | A * | 8/1998 | Yelton et al. | 424/133.1 |
| 5,800,782 | A | 9/1998 | Hagstrom et al. | |
| 5,853,752 | A | 12/1998 | Unger et al. | |
| 5,871,699 | A | 2/1999 | Ruggeri | |
| 5,879,627 | A | 3/1999 | Tanihata | |
| 5,908,054 | A | 6/1999 | Safabash et al. | |
| 5,919,356 | A | 7/1999 | Hood | |
| 5,957,166 | A | 9/1999 | Safabach | |
| 6,017,891 | A * | 1/2000 | Eibl et al. | 514/21 |
| 6,146,594 | A | 11/2000 | De Graaff et al. | |
| 6,190,616 | B1 | 2/2001 | Jovanovich et al. | |
| 6,391,316 | B1 * | 5/2002 | Potter et al. | 424/256.1 |
| 6,440,736 | B1 * | 8/2002 | Logtenberg et al. | 435/375 |
| 6,500,571 | B2 * | 12/2002 | Liberatore et al. | 429/2 |
| 6,521,213 | B1 * | 2/2003 | Mautone | 424/45 |
| 6,582,665 | B2 | 6/2003 | Faulkner | |
| 6,599,441 | B1 * | 7/2003 | Chrislip et al. | 422/245.1 |
| 6,607,522 | B1 * | 8/2003 | Hamblin et al. | 606/8 |
| 6,709,692 | B2 * | 3/2004 | Sudor | 427/2.1 |
| 6,855,296 | B1 | 2/2005 | Baker et al. | |
| 6,858,439 | B1 | 2/2005 | Xu et al. | |
| 6,887,686 | B2 * | 5/2005 | Potter et al. | 435/69.1 |
| 6,889,727 | B2 * | 5/2005 | Olson et al. | 141/130 |
| 6,975,924 | B2 | 12/2005 | Kircher et al. | |
| 7,001,890 | B1 * | 2/2006 | Wagner et al. | 514/44 |
| 7,077,826 | B1 * | 7/2006 | Gray | 604/171 |
| 2001/0007641 | A1 | 7/2001 | Jovanovich et al. | |
| 2002/0001544 | A1 | 1/2002 | Hess et al. | |
| 2002/0006360 | A1 | 1/2002 | Neal et al. | |
| 2002/0173046 | A1 | 11/2002 | Hafez et al. | |
| 2003/0096418 | A1 | 5/2003 | Yamazaki et al. | |
| 2003/0143115 | A1 | 7/2003 | Tanimoto et al. | |
| 2003/0161813 | A1 * | 8/2003 | Logtenberg et al. | 424/93.2 |
| 2004/0010224 | A1 * | 1/2004 | Bodmeier | 604/82 |
| 2004/0141996 | A1 * | 7/2004 | Gelder | 424/188.1 |
| 2005/0182463 | A1 * | 8/2005 | Hunter et al. | 607/115 |
| 2006/0094119 | A1 * | 5/2006 | Ismagilov et al. | 436/53 |

FOREIGN PATENT DOCUMENTS

| | | | |
|---|---|---|---|
| DE | 3102142 | A1 | 8/1982 |
| EP | 0 148 116 | A1 | 7/1985 |
| EP | 0148116 | A1 | 7/1985 |
| EP | 01481116 | A | 7/1985 |
| EP | 0426634 | A2 | 5/1991 |
| GB | 1031427 | | 8/1963 |
| WO | WO 96/39125 | A1 | 12/1996 |
| WO | WO 99/04761 | A1 | 2/1999 |

OTHER PUBLICATIONS

Rummel, G., Hardmeyer, A., Widmer, C., Chiu, M., Nollert, P., Locher, K., Pedruzzi, I., Landau, E.M., Rosenbusch, J., Lipidic Cubic Phases: New Matrices for the Three-Dimensional Crystallization of Membrane Proteins, Journal of Structural Biology, 121, pp. 82-91, 1998.

Loewen, M., Chiu, M.L. Widmer, C., Landau, E.M., Rosenbusch, J.P., Nollert, P., G-Protein Coupled Receptors. Methods in Signal Transduction. Chapter 14, X-Ray Crystallography of Membrane Proteins: Concepts and Applications of Lipidic Mesophases to Three-Dimensional Membrane Protein Crystallization CRC-Press; T. Haga, G. Berstein (Eds.), pp. 365-388, 2000.

Chiu, M.L., Nollert, P., Loewen, M., Belrhali, H., Pebay-Peyroula, E., Rosenbusch, J.P., Landau, E. M., Crystallization in cubo: General Applicability to Membrane Proteins, Acta Cryst. D56, 781-784 (2000).

Chen, A.H., Hummel, B., Qiu, H., Caffrey, M., A Simple Mechanical Mixer for Small Viscous Lipid-Containing Samples, Chemistry and Physics of Lipids, 95:11-21, 1998.

Nollert, P., Landau, E.M., Enzymic Release of Crystals from Lipidic Cubic Phases, Biochemical Society Transactions 26(4), pp. 709-713, 1998.

Nollert, P., Royant, A., Pebay-Peyroula, E. Landau, E.M., Detergent-Free Membrane Protein Crystallization, FEBS Letters 457:205-208, 1999.

Landau, E.M., Runnel, G., Cowan Jacob, S.W., Rosenbusch, J.P., Crystallization of a Polar Protein and Small Molecules from the Aqueous Compartment of Lipidic Cubic Phases, Journal of Physical Chemistry B, 101:1935-1937. 1997.

Edman, K., Nollert, P., Royant, A., Belrhali, H., Pebay-Peyroula, E., Hajdu, J., Neutze, R., Landau, E.M., High-Resolution X-ray Structure of an Early Intermediate in the Bacteriorhodopsin Photocycle, Nature, vol. 41, pp. 822-826, Oct. 21, 1999.

Luecke, H., Schobert, B., Richter, H.T., Cartailler, J.P., Lanyi, J.K., Structural Changes in Bacteriorhodopsin During Ion Transport at 2 Angstrom Resolution, Science 286:255-260, Oct. 8, 1999.

Luecke, H., Schobert, B., Richter, H.T., Cartailler, J.P., Lanyi, J.K. , Structure of Bacteriorhodopsin at 1.55 Angstrom Resolution, Journal of Molecular Biology, 291:899-911, 1999.

Belrhali, H., Nollert, P., Royant, A., Menzel, C., Rosenbusch, J.P., Landau, E.M., Pebay-Peyroula, E., Protein, Lipid and Water Organization in Bacteriorhodopsin Crystals: A Molecular View of the Purple Membrane at 1.9 A Resolution, Structure, vol. 7, No. 8, 909-917, Jul. 12, 1999.

Luecke, H., Richter, H.T., Lanyi, J.K., Proton Transfer Pathways in Bacteriorhodopsin at 2.3 Angstrom Resoultion, Science, 280:1934-1937, Jun. 19, 1998.

Pebay-Peyroula, E., Rummel, G., Rosenbusch, J.P., Landau, E.M., X-Ray Structure of Bacteriorhodopsin at 2.5 Angstroms from Microcrystals Grown in Lipidic Cubic Phases, Science, 277:1676-1681, 1997.

Chang, C.M., Bodmeier, R., Effect of Dissolution Media and Additives on the Drug Release from Cubic Phase Delivery Systems, Journal of Controlled Release, 46:215-222, 1997.

Longer, M., Tyle, P., Mauger, J.W., A Cubic-Phase Oral Drug Delivery System for Controlled Release of AG336, Drug Development and Industrial Pharmacy, 22:603-608, 1998.

USPTO; Non-Final Office Action for U.S. Appl. No. 10/688,650; mailed Jun. 20, 2007.

USPTO; Non-Final Office Action for U.S. Appl. No. 10/688,650; mailed Nov. 27, 2007.

USPTO; Non-Final Office Action for U.S. Appl. No. 10/688,650, mailed Jun. 20, 2007.

USPTO; Non-Final Office Action for U.S. Appl. No. 10/688,650, mailed Jan. 17, 2007.

William F. Vobach, Amendment, filed Sep. 20, 2007.

* cited by examiner

METHOD AND APPARATUS FOR PREPARING LIPIDIC MESOPHASE MATERIAL

CROSS-REFERENCES TO RELATED APPLICATIONS

This application is a divisional application of U.S. patent application Ser. No. 09/908,429 filed Jul. 18, 2001 entitled "METHOD AND APPARATUS FOR PREPARING LIPIDIC MESOPHASE MATERIAL", which claims the benefit of U.S. patent application Ser. No. 60/219,016 filed Jul. 18, 2000 entitled "PROCEDURE AND SYRINGE APPARATUS FOR SCREENING LIPIDIC MESOPHASES FOR PROTEIN CRYSTALLIATION" which is hereby incorporated by reference for all purposes.

The embodiments of this invention relate generally to systems for preparing viscous materials, such as lipidic mesophases.

BACKGROUND

Three dimensional protein structures have extremely high commercial value since they allow for the use of rational (structure-based) design and engineering of novel drug molecules that bind to the protein of interest. Furthermore, they facilitate the rational engineering of novel proteins with desired properties. One method of protein X-ray crystallographic structure determination involves: (1) preparation of purified protein; (2) crystallization of the protein; (3) isolation and alignment of single protein crystals in front of an intense and focused X-ray beam; (4) collection of complete X-ray diffraction data sets by rotating the single crystal within the X-ray beam; (5) capturing the diffraction spots on a recording device that measures X-ray spot position and intensity; (6) computational analysis of the X-ray diffraction data to derive experimental electron density maps of the crystal. These maps are in turn used to derive a three dimensional chemical model of the protein that formed the crystal. However, a general problem in the use of X-ray diffraction methods to determine the three-dimensional structures of proteins at near atomic resolution is the rate-limiting step of protein crystallization.

Membrane proteins are a broad class of proteins which bind to and/or traverse a lipid bilayer (membrane) that surrounds all living cells. Membrane proteins are typically involved in the controlled movement of substances and/or signals across the cell membrane. In so doing, membrane proteins enable rapid communication between the inside and outside of living cells. Examples of membrane proteins include ion channels, signaling receptors, hormone receptors, light receptors, and adhesion proteins. Such membrane proteins are the targets of several blockbuster drugs on the market as well as a variety of drugs under development at pharmaceutical companies to treat numerous aliments.

Historically, membrane proteins have been notoriously difficult to crystallize. This is due to their hydrophobic (water hating) and/or lipophilic (fat loving) nature which makes them difficult to purify in large quantity and reduces their overall solubility in aqueous solutions. These factors make it difficult to crystallize membrane protein since they tend to be unstable at concentration in aqueous solutions that are required for the nucleation of crystal growth by crystallization methods used for soluble (non-membrane bound) proteins.

In 1996, Landau and Rosenbusch described the novel use of Lipidic Cubic Phases for the crystallization of membrane proteins. According to this method, detergent solubilized membrane protein is mixed with monoolein (or monopalmitolein) and water (or buffered solutions), followed by multiple rounds of centrifugation. This extensive method allowed for gentle mixing of the materials over 2 to 3 hours to create a viscous, bicontinuous cubic phase, a cured lipid bilayer, extending in three dimensions and permeated by aqueous channels. The membrane proteins can partition into the lipid bilayer and can diffuse in three dimensions which allows them to explore many potential spatial packing configurations that can lead to crystal growth of the protein within lipidic mesophases, such as the so called "Lipidic Cubic Phase" (LCP).

The Landau and Rosenbusch original LCP crystallization method involves the use of small glass vials into which monoolein, protein and buffered water are added, followed by multiple centrifugations to create the LCP. After the LCP is created, small quantities of dry salt are added and the vials are sealed and incubated. Crystal growth is monitored by examining each glass vial under a stereo microscope. This original lipidic mesophase protocol is tedious, time consuming, and requires more initial protein material than the amount that is necessary for conventional crystallization based on vapor diffusion. The addition of dry salt is time consuming, in particular, as it requires a precision weighing step. In addition, the observation of crystal growth is tedious since it involves multiple tube handling events. Because of these limitations the Landau and Rosenbusch LCP method has generally not been put to use by the protein crystallography community.

SUMMARY

In one embodiment of the invention, a coupling device is provided comprising a first receptacle that is operable for coupling with a first syringe; a second receptacle operable for coupling with a second syringe and a channel disposed between the first receptacle and the second receptacle so as to allow fluid to flow from-the first receptacle to the second receptacle. The first receptacle can be of a different size from the second receptacle so as to allow different sizes of syringes to be coupled to one another. Such a configuration can be useful as it can facilitate the coupling and the transfer of fluid from a large syringe to a smaller syringe. Furthermore, a tube, such as a needle, can be disposed in the channel so as to facilitate the flow of fluid from one syringe to the other syringe. Also, this embodiment of the invention can be comprised of a heat insulating material, such as PEEK (polyether ether ketone) material, so as to reduce the exchange of heat from a lab worker to the material disposed within the coupling system. Also, a first ferrule can be disposed in the first receptacle so as to facilitate the coupling between the first receptacle and the first syringe. Similarly, a second ferrule can be utilized with the second receptacle to facilitate coupling with the second syringe.

In another embodiment of the invention a method of transferring viscous material, such as lipidic cubic phase material, can be used to transfer the viscous material from a first syringe barrel to a second syringe barrel. This can be accomplished by providing a first syringe barrel containing a volume of viscous material, the first syringe barrel having a first volume size; providing a coupling device; coupling the first syringe barrel with the coupling device; providing yet another syringe barrel having a different volume size from that of the first syringe barrel; coupling this second syringe barrel with the coupling device; and utilizing air pressure to transfer at least a portion of the viscous material to the second syringe barrel from the first syringe barrel. This can facilitate the transfer of fluid or viscous material from a larger syringe to a syringe that is better suited for dispensing the material in small quantities or containers. For example, it can particularly be used for transferring lipidic mesophases, such as LCP, after the lipidic mesophase is mixed by two large syringes (as it is very difficult to mix lipidic mesophases in small syringes). A channel of the coupling device can be used to transfer the viscous material. Furthermore, a needle disposed in the channel can be selected having a sufficiently short length so as to prevent breakage of the syringes during the transfer process.

In another embodiment of the invention, a syringe can be provided for dispensing viscous material, such as in a microwell. For example, a needle of a syringe can be configured so as to have a length of less than about 20 mm and an outside diameter of the needle of about 0.4 mm to about 0.72 mm as well as an inside diameter of the needle of about 0.10 mm to about 0.16 mm. Furthermore, the needle can be sized appropriately so as to dispense lipidic mesophase material without causing breakage of the syringe apparatus during operation.

In yet another embodiment of the invention, a kit of equipment for dispensing or mixing lipidic mesophases or other viscous materials can be provided. For example, a kit can be provided to include: a first syringe having an opening sufficient for receiving lipid material; a second syringe or vessel operable for holding protein solution; and, a coupling device operable for coupling the two syringes together during mixing of the lipid material with the protein solution. Similarly, a smaller syringe can be provided as part of the kit which is operable for dispensing the lipidic mesophase material once it has been mixed. In addition, a coupling device which facilitates the coupling of the large syringe with the smaller syringe as well as the transfer of lipidic mesophase material from the large syringe to the small syringe can be provided. Also, a semi-automatic dispenser can be provided for use with the dispensing syringe and a microwell can be provided for holding mixtures of solution and lipidic mesophase material. The various components of the kit can be provided in a variety of combinations.

DETAILED DESCRIPTION

Protein structures are usually determined by X-ray diffraction of the respective crystals. Membrane proteins are particularly difficult to crystallize using conventional methods, such as the vapor diffusion method. However, as membrane proteins are coded for by approximately 30% of the genome of all known genomes, their structures are of extremely high interest.

Some previous testing methods have been undesirable because of the time involved to perform the experiments and the amount of wasted material. Namely, only a few crystallization experiments can be set up in one day by one person. Since large numbers (hundreds to thousands) of crystallization conditions are often tested in order to find a lead, such testing methods have been undesirable due to the excessive number of handling steps involved. Furthermore, there is an inherent waste of test material in such methods. Since the test material (e.g., lipid and protein) is scarce to begin with, this waste of material often prevents a sufficient number of tests from being conducted.

Furthermore, the problems in setting up an LCP crystallization experiment are rooted in the difficulty of physically manipulating the highly viscous lipidic phase material. For example, the mechanical properties of the LCP material do not readily allow pipetting which is commonly used to manipulate liquids. Nor can LCP be dealt with as a solid because the material is sticky and dehydrates quickly. However, the lipidic material is thixotropic and flows provided sufficient pressure is applied such as in positive displacement syringes.

In order to alleviate some of the difficulties in previous lipidic mesophase crystallization methods, the various embodiments of the invention have been developed. Thus, for example, the handling steps can be implemented so as to consume less material for a single crystallization set up and/or allow the use of standard multiwell plates to facilitate the number of tests conducted. Furthermore, the handling activities involved are compatible with automation and hence crystallization set-ups may be prepared in a high throughput manner by a machine.

The various embodiments of the invention described herein can satisfy some of the problems inherent in previous testing procedures. For example, the quantity of LCP material needed for testing purposes can be reduced to 0.2 microliters from 10-20 microliters needed in some methods. This reduction to 1/50 or 1/100 of the scarce testing material thus can dramatically increase the number of tests that can be performed.

Figure 1:
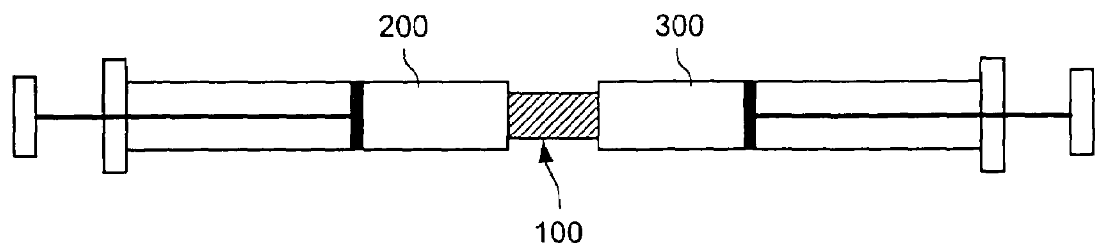
FIG. 1 illustrates an embodiment of the invention for mixing a viscous material, such as LCP, utilizing two syringes coupled between a coupling device.

FIGS. 1, 2, 3 and 4 illustrate an overview of the process according to one embodiment of the invention for preparing a viscous material (e.g., material having a viscosity in the range from 1 centipore to 300,000 centipoise, such as LCP material which can have a viscosity in the range of 100,000 centipoise to 300,000 centipoise) and depositing the material in a microwell. In FIG. 1, a first syringe 200, such as a 250 microliter syringe, is shown coupled to a second syringe 300 having a similar or equal volumetric size. A coupling device 100 is shown coupling the barrels of the respective syringes so as to facilitate the transfer of material from the first syringe to the second syringe. In preparation of LCP, a lipid can be deposited in the barrel of one syringe, e.g., by using a spatula, and a protein solution can be deposited in the second syringe. Mixing occurs when each syringe alternately ejects material into the other syringe.

Figure 2:
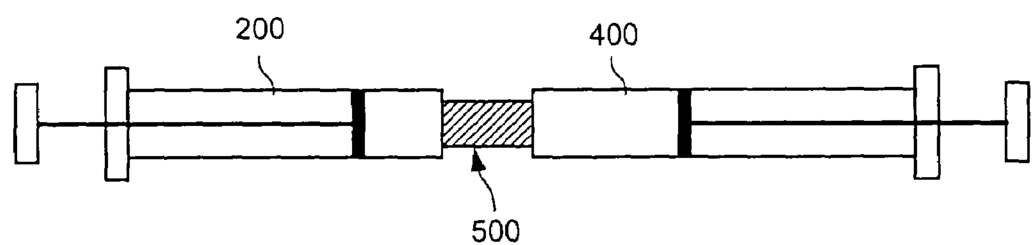
FIG. 2 illustrates an embodiment of the invention for transferring the mixed material from FIG. 1 from a large syringe to a smaller syringe.

In FIG. 2, once the LCP mixture has been created, the LCP material can be transferred to a smaller syringe so as to facilitate dispensing of the LCP material, for example, dispensing in a microwell. Use of a smaller syringe helps to dispense the LCP in smaller and more accurate quantities as well as to manipulate a syringe needle in tighter quarters. For example in FIG. 2, the first syringe 200 containing the mixed LCP material is coupled to a smaller syringe 400 by a coupling device shown as 500. The plunger of the syringe 200 can be pushed so as to transfer the LCP material through the channel of the coupling device 500 into the smaller syringe 400.

Figure 3:
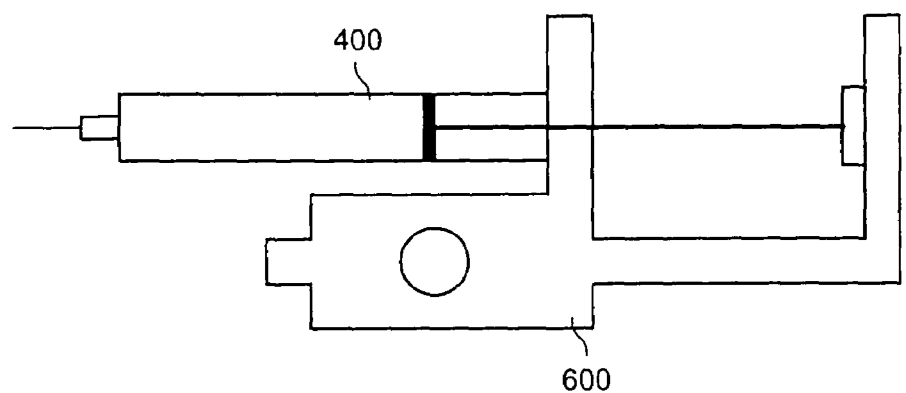
FIG. 3 illustrates an embodiment of the invention in which the smaller syringe of FIG. 2 is coupled to a repetitive micro-dispensing device.
Figure 4:
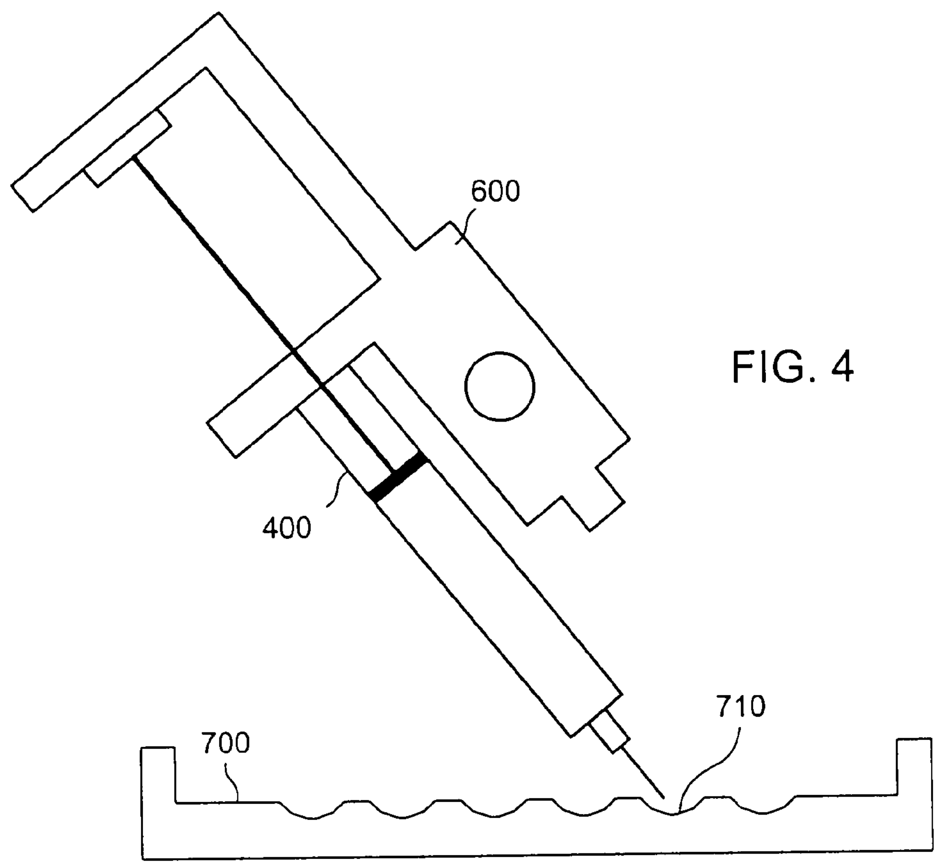
FIG. 4 illustrates an embodiment of the invention for dispensing material from the small syringe of FIG. 3 into a well plate, such as a microwell plate.

In FIG. 3, the smaller syringe 400 is shown coupled to a semi-automatic dispenser 600 which is operable for dispensing accurate quantities of the LCP material. Such a dispensing operation is shown on FIG. 4 where the semi-automatic dispenser 600 and syringe 400 are shown ejecting LCP material into a well 710 of a microwell plate 700. The well can then be used to combine the LCP with a crystallization promoting agent. The resulting crystal can then be tested by X-ray diffraction to determine a three dimensional structure of the protein.

Figure 5:
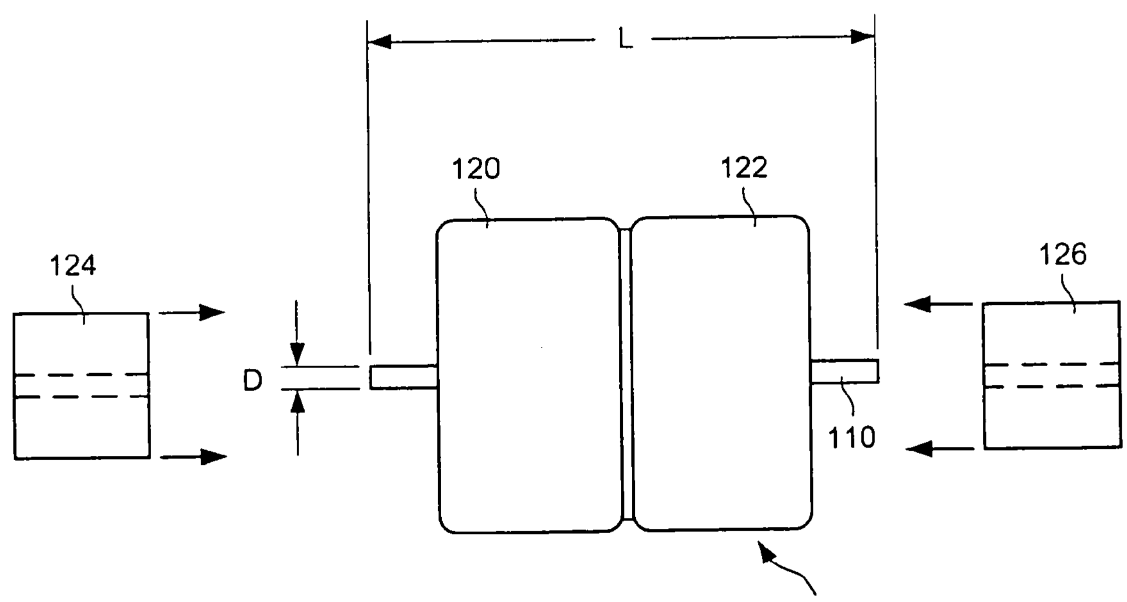
FIG. 5 illustrates an embodiment of the invention utilized to couple two syringes of equal size.

FIG. 5 shows the coupling device 100 from FIG. 1 in greater detail. A needle 110 is disposed through the coupling device so as to provide a channel for transferring material between the first and second syringes shown in FIG. 1. The length of the needle is designated as "L" in FIG. 5. Furthermore, a diameter "D" is shown for the needle. The coupling device has a first receptacle 120 and a second receptacle 122. The first and second receptacles in this embodiment are of equal dimension so as to allow coupling to syringe barrels of equal size. A typical National Pipe Thread (NPT) fitting can be utilized for screwing the coupling device onto a syringe barrel. Also shown in FIG. 5 are ferrules, such as Teflon ferrules 124 and 126, which are disposed within the first and second receptacles, respectively, and over the needle so as to receive the barrel of the syringe and facilitate a gas tight coupling with the coupling device 100. A first Teflon ferrule 124 can be disposed within the first receptacle 120 and a second Teflon ferrule 126 can be disposed within the second receptacle 122 as illustrated by the arrows. Thus a secure coupling of the two syringes can be accomplished utilizing these ferrules when they are placed against the barrels of the syringes during operation.

Figure 6:
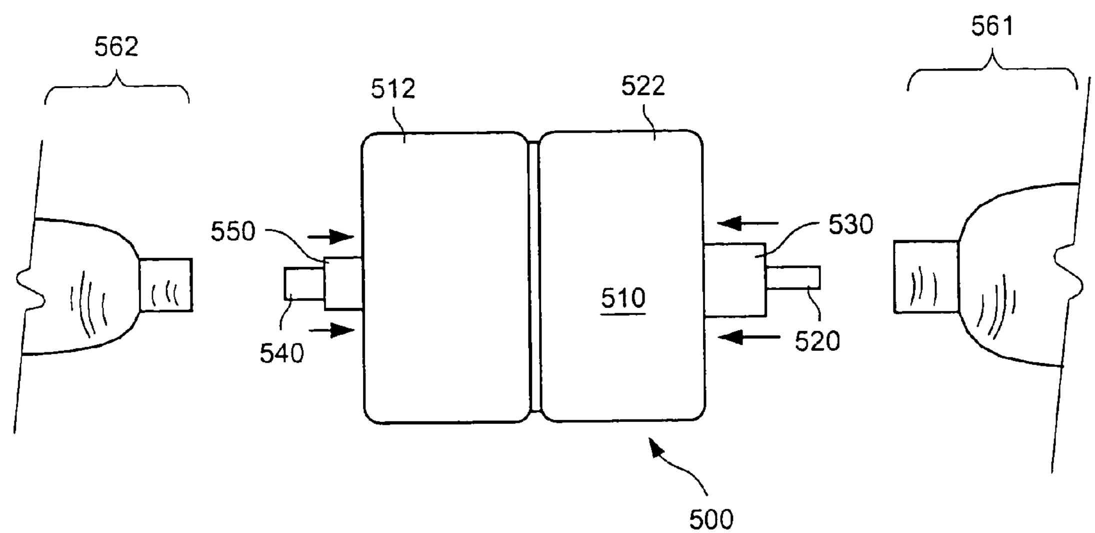
FIG. 6 illustrates an embodiment of the invention for coupling two syringes of different size.

FIG. 6 illustrates yet another coupling device. The embodiment in FIG. 6 illustrates a coupling system designated as 500 having a coupling body 510, a first receptacle 512 and a second receptacle 522. The first receptacle is sized appropriately to receive a barrel of a syringe 561. The barrel of the syringe can be disposed so as to mate with (e.g., to be placed against one another physically so as to restrict loss of fluid during operation) a receiving ferrule shown as 530 in FIG. 6. The receiving ferrule 530 is seated in the first receptacle 522. Similarly, a second yet smaller syringe 562 can be coupled to the second receptacle 512. The second syringe also mates with a receiving ferrule 550 which is sized appropriately to mate with the dimensions of the second syringe. A tube 520 is disposed through the coupling device so as to facilitate transfer of fluid from the first syringe to the second syringe when the first and second syringes are coupled with the coupling device. For example, the tube can be disposed within both the barrels of the first and second syringes when they are operatively coupled to the coupling device.

Figure 7:
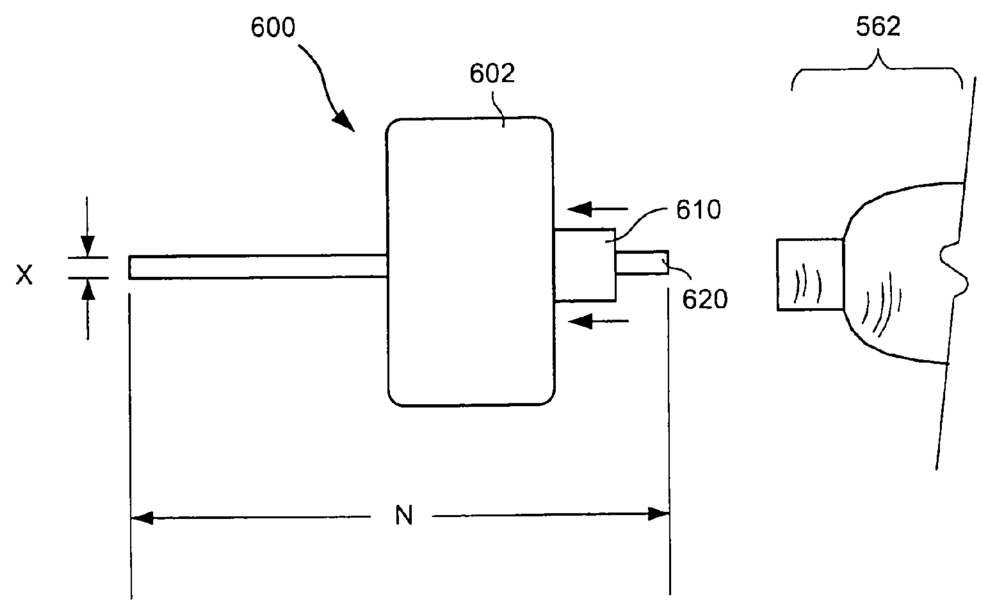
FIG. 7 illustrates an embodiment of the invention for use as a dispensing needle on a syringe.

FIG. 7 illustrates a dispensing needle operable for dispensing viscous material, such as LCP. This dispensing needle can be coupled to a syringe after viscous material is transferred to the syringe barrel. FIG. 7 shows a coupling device 600 having a first receptacle 602 for receiving the barrel of a syringe. A ferrule 610 is shown seated in the receptacle so as to facilitate coupling or mating with the barrel of the syringe. Also shown is a needle 620 having a length N and an inside diameter X disposed through the ferrule 610 and the first receptacle of the coupling body so as to be disposed within the barrel of the syringe when the barrel of the syringe 562 is operatively coupled with the first receptacle 602.

The needle is sized appropriately so as to prevent breakage of the barrel during dispensing of viscous material, such as LCP material. Namely, the length N and inside diameter X can be selected so as to prevent breakage of the syringe when the LCP material is ejected through the needle. Typically one of the standard size gauges for needles (26S or 22S, e.g., Hamilton model numbers 80075 and 80064, respectively) can be used for the internal diameter. In one embodiment, a needle length N is selected having a length of less than about 20 millimeters (preferably less than about 19 mm or even more preferably less than about 18 mm), an outside diameter of about 0.4 mm to about 0.72 mm, and an inside diameter of about 0.10 mm to about 0.16 mm.

Figure 8:
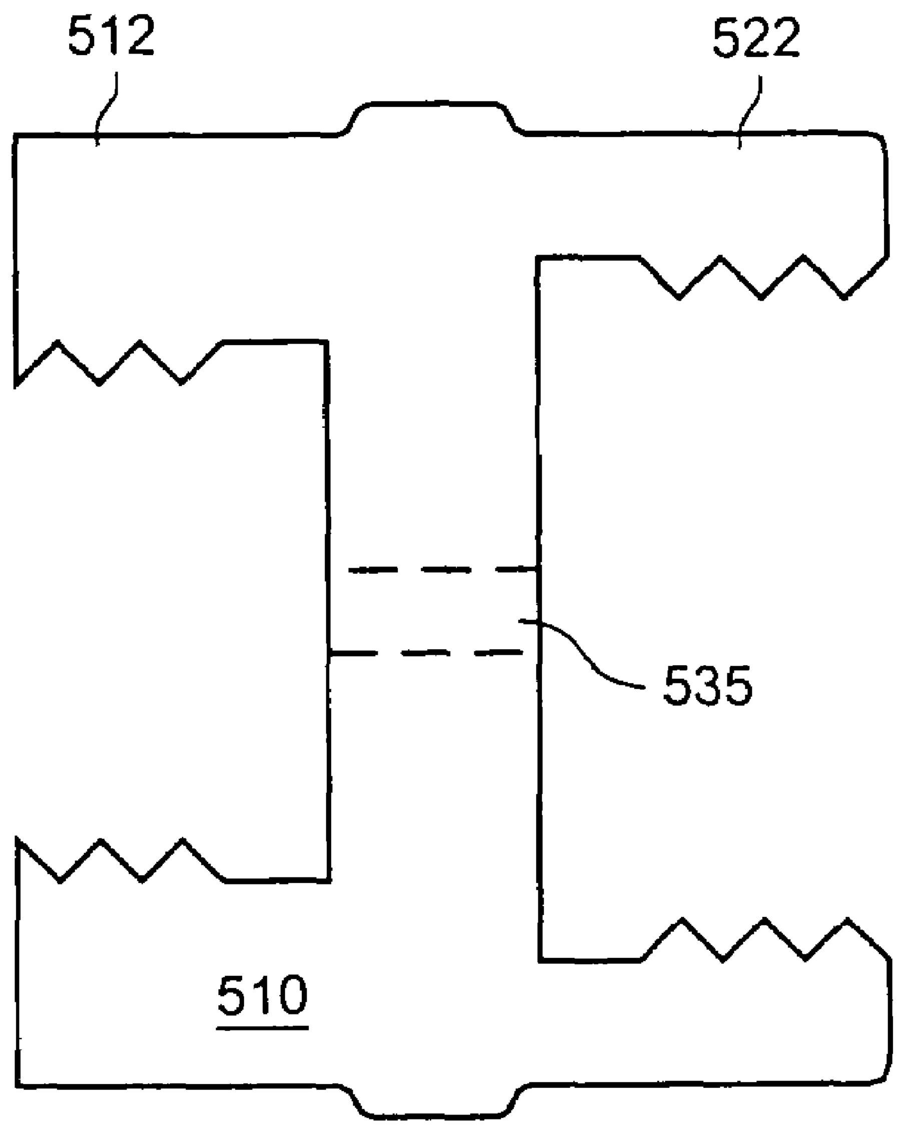
FIG. 8 illustrates a cross section of the embodiment of the invention shown in FIG. 6.

In FIG. 8, a cross-section of the embodiment of the coupling device 500 shown in FIG. 6 is illustrated. A coupling body 510 is provided having a first receptacle 522 having a first diameter and a second receptacle 512 having a second and smaller diameter. A channel is shown as a cylindrical bore 535 through the coupling body 510. In FIG. 8, the first and second receptacles are shown having NPT fittings for receiving barrels from syringes. Furthermore, the receptacles are sized to permit ferrules to be seated in the receptacles to facilitate mating with the barrel of the syringes. A similar configuration could be utilized for the coupling device 100 of FIG. 5; however, the receptacles would be sized equally so as to accommodate equally sized syringes.

Figure 9:
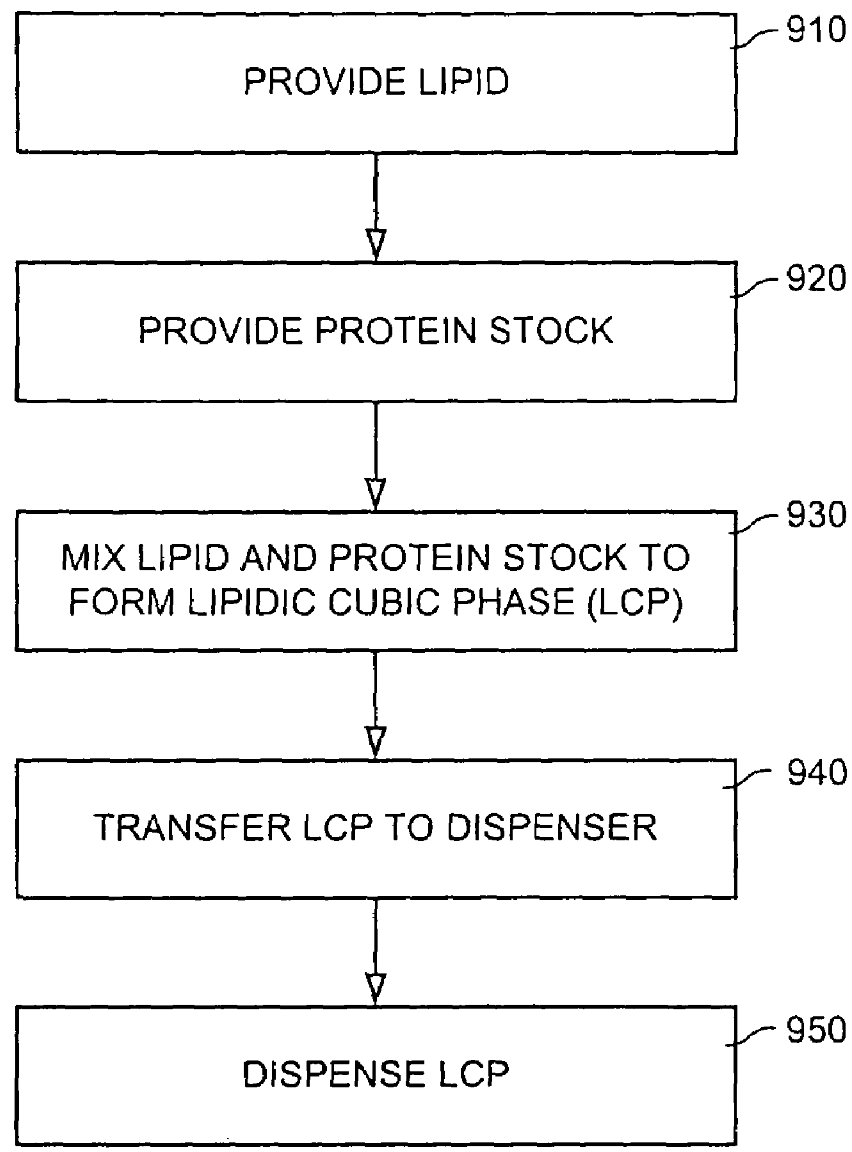
FIG. 9 illustrates a flow chart for a method of dispensing LCP or other viscous material according to one embodiment of the invention.

FIG. 9 illustrates an overview of the process for dispensing a viscous material like LCP according to one embodiment of the invention. As a precursor to the process, one would normally make sure that all syringes, ferrules, and needles have been thoroughly cleaned with distilled water and ethanol. After cleaning the syringes, the plungers are removed and allowed to air dry before use. Furthermore, sealing tape strips are cut for covering the mircowells. A 250 μl syringe and plunger can be selected and coupled with the mixer coupling such as that shown in FIG. 5. The coupling can be threaded on with a white Teflon ferrule seated inside. This combination can then be used to calibrate a balance.

The plunger is again removed from the 250 μl syringe. Then a lipid ampule or (microcentrifuge tube containing a lipid) can be removed from the freezer. The waxy block of lipid can be thawed by warming the ampule or microtube in the user's hand. For example, monoolein thaws at approximately 36° C. Using a standard laboratory pipettor with a 200 μl tip, a volume of liquid lipid that is equivalent to the volume of protein that will be screened can be removed. The lipid is injected into the back end of the 250 μl glass barrel syringe which had its plunger removed. Thus, according to block 910, an amount of a lipid can be provided.

The plunger is pushed back into the barrel of the 250 μl syringe and pointed upward relative to the ground and slowly moved up the glass barrel. This forces the lipid up the barrel and removes any air bubbles that might be trapped in the lipid.

While holding the 250 μl syringe straight up, the plunger is carefully moved forward to push the lipid up the syringe barrel until it just begins to bleed out of the end of the 250 to 250 coupling device. In doing this, all air bubbles can be removed. The 250 μl syringe is then weighed with the lipid using the balance which was zeroed on the empty 250 μl syringe and coupling combination; and the mass of the lipid is recorded. Typically, the lipid is approximately 1 mg per ml.

In block 920 of method 900 protein stock can be provided. For example, a clean 250 μl syringe can be primed with distilled water. Priming can be achieved by drawing water into the 250 μl syringe via a long needle which has been attached with the Teflon ferrule inside. The syringe is pointed straight up relative to the ground and the water is plunged out while flicking the end of the syringe to ensure that all air bubbles are removed. All water is ejected out of the syringe and excess water is removed from the end of the needle by touching the syringe needle to a clean tissue. The water primed 250 μl syringe is used to take up the desired quantity of protein stock, for example, 100 μl of Phosphate buffer having a pH of 6.0. The long needle is carefully removed from the protein loaded 250 μl syringe leaving the Teflon ferrule in the head of the syringe.

Having accomplished loading the second syringe with protein stock, the lipid and protein stock can be mixed to form lipidic cubic phase as illustrated in block 930 of the method 900. This can be accomplished, for example, by attaching the protein loaded 250 μl syringe to the second receptacle of the coupling device which is already attached to the lipid loaded 250 μl syringe. The syringe containing the protein stock should not be over tightened onto the coupling device as this could crack the syringes. The lipidic cubic phase is created by mixing the protein solution with the lipid. This can be achieved by plunging the plungers of the head to head connected 250 μl syringes back and forth several times. For example, one plunge can be performed every second at room temperature (25° C.). During the first few plunges, the mixture should turn white and cloudy. The ends of the syringes can be checked to make sure no leaks are detected. By plunging gently, and not exerting excessive force, breakage of the assembly can be avoided. The plunging should continue back and forth until some of the LCP material starts to become transparent which will typically take ten to twenty plunges. This indicates that the LCP is beginning to form. The plunging should continue back and forth approximately 100 cycles being careful not to place angular stress on the coupled syringes. In order to get a good transparent mix, e.g., no cloudy regions remaining, it will typically require at least 50 to 100 cycles. If the mixture is not totally transparent, cooling the joined syringes, by placing them in a refrigerator for example, or by letting them sit on a bench top for a few minutes can be accomplished. The heat from the user's hands can heat the syringes making it difficult for the transparent cubic phase to form. Once the syringes have cooled, the plunging can be initiated to get uniform mixing of the transparent cubic phase.

One material that is useful in insulating the viscous mixture from external heat is a non-metallic material such as PEEK. This PEEK material may be utilized in fashioning the devices, particularly the coupling devices. It is a durable material that does not readily transfer heat from the lab worker's fingers to the viscous material. Thus, it helps speed the preparation of the LCP material as one would be less likely to have to wait for the LCP material to cool. Furthermore, it can be useful in avoiding damage to the fragile protein material by avoiding heat build-up.

Having accomplished the creation of the LCP, the LCP can be transferred to a dispensing device, such as a smaller syringe. In block 940 of method 900 the LCP is transferred to a dispensing unit, such as a 10 μl syringe. (The 10 μl syringes are difficult to use to mix LCP because the openings are too small to easily deposit lipid material, for example, with a spatula; however, they allow for precise dispensing of the scarce LCP material.) The existing coupling of the syringe containing the LCP and the empty syringe are disconnected leaving a single 250 μl syringe disconnected from the coupling yet containing the LCP material. A 250 μl to 10 μl syringe coupling is then threaded onto the 250 μl syringe containing the LCP. The union is finger tightened to form a gas tight seal with the Teflon ferrule of the 250 μl syringe as discussed in regard to FIG. 6. Then, the 10 μl syringe is similarly coupled with the coupling device. This can be accomplished by first assembling the 10 μl syringe into a repeating dispenser, such as a semi-automatic dispenser manufactured by Hamilton, Model PB600. The repeating dispenser is configured with its index rod and plunger arm fully extended. The doughnut shaped syringe holder nut is used to hand tighten the 10 μl syringe into the repeating dispenser. The coupling device which is already screwed onto the LCP loaded 250 μl syringe is then screwed onto the 10 μl syringe mounted in the repeating dispenser. These couplings are then gently hand tightened. The plunger of the 250 μl syringe is then gently pushed causing the LCP material to be plunged into the 10 μl syringe. It is often helpful to gently pull on the 10 μl syringe plunger as positive pressure is placed on the 250 μl syringe plunger. This facilitates LCP filling of the 10 μl syringe. As the syringe plunger approaches the top of the barrel (9-10 μl mark), the metal top end of the syringe plunger is directed to enter the hole in the plunger arm of the repeating dispenser. Then the locking screw is tightened so as to hold the plunger to the plunger arm. Minor changes in the orientation of the plunger may be required to ensure a tight fit on the plunger.

At this stage, the LCP can now be dispensed as shown in block 950 of method 900. The two syringes are disconnected from one another leaving the coupling unit coupled to the 250 μl syringe and the 10 μl syringe coupled to the repeating dispenser. The small Teflon ferrule is left in the tip of the 10 μl syringe. A short syringe needle, as shown in FIG. 7, is then assembled onto the Teflon ferrule of the 10 μl syringe and hand tightened with its nut. The dispenser is then clicked several times so that the user can watch the cubic phase come out of the short steel needle. When this occurs, a snake-like string of LCP is ejected from the needle.

Prior to dispensing the LCP material, crystallization promoting agent is deposited. This can be accomplished by using a microsyringe pipette to transfer one μl aliquots of crystallant into the drop chambers of the crystallization plate. The plate seal may optionally be left on for this operation. The dispensing can be achieved by the following steps: (1) fully depress the micro syringe to the plunger; (2) thrust the needle through the plate seal entry pore for the desired crystallant; (3) release the plunger in order to draw 2 μl of crystallant into the microsyringe; and (4) pull the microsyringe out of the seal and use it to dispense 1 μl of crystallant to the desired plate drop chamber location. To prevent cross contamination of crystallants, perform three quick fill/dispense cycles in a 10 ml pool of water before dispensing each crystallant. When using a 72 well Terasaki plate manufactured by Nunc, fill 6 wells in a row with 1 μl of each of the crystallant solutions. When using a Clover plate, fill 8 wells in a row with 1 μl of each of the crystallant solutions.

The LCP can then be dispensed into each well. For example, inject 200 nanoliters of LCP from the LCP loaded repeating dispenser into the crystallization solution in each drop chamber that contains crystallant. To prevent cross contamination of crystallant, dip the syringe tip in a 10 milliliter pool of water and dab dry on an absorbent tissue between each dispense step. The drop chambers can then be sealed with the sealing tape. Then, the LCP-crystallization plates can be stored between −10 and 50° C. or typically between 4 and 25° C. until the time observations are made.

The LCP material can be dispensed in a variety of different containers. For example, a microtiter plate could be used, such as a 96 well, a 1536 well plate, or the like. Alternative footprints could also be used in addition to these. Furthermore, a microarray could be utilized as the container. Thus, the LCP material could be deposited on the microarray so as to allow a plurality of different testing procedures to be performed. In addition, a robot could be utilized to deposit the LCP material and associated testing solutions. Thus, a plurality of syringes could be used to dispense different chemicals for use with the LCP testing. Similarly, the mechanized dispensing of the LCP could be accomplished through the use of software stored on a computer.

Figure 10:
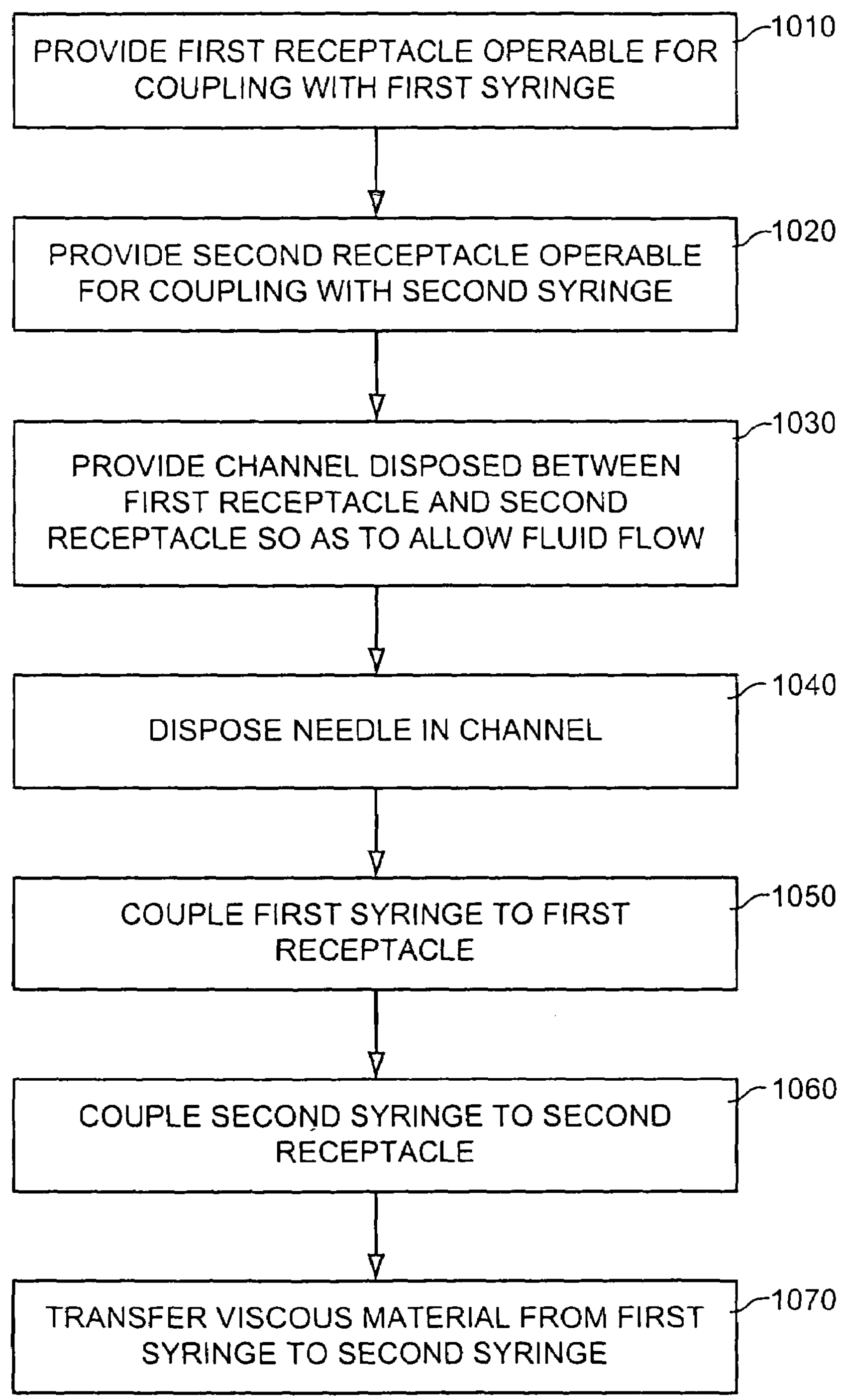
FIG. 10 illustrates a flow chart for a method of mixing viscous material according to one embodiment of the invention.

FIG. 10 illustrates a more detailed view of the method of mixing a lipid and protein stock. In block 1010 of method 1000 a first receptacle operable for coupling with a first syringe is provided on a coupling device. The coupling device is also provided with a second receptacle operable for coupling with a second syringe as illustrated in block 1020. A channel is disposed between the first receptacle and the second receptacle so as to allow for fluid to flow between the first and second receptacle as illustrated in block 1030. For example, a needle can be disposed in the channel as noted in block 1040. The first syringe is coupled to a first receptacle in block 1050 while the second syringe is coupled to the second receptacle as illustrated in block 1060. Then the lipid and protein stock can be mixed by repeatedly and alternately plunging the plungers of each syringe. The viscous material can be formed and transferred from the first syringe to the second syringe and vice versa. This process can be repeated until the LCP material, for example, is formed.

Figure 11A:
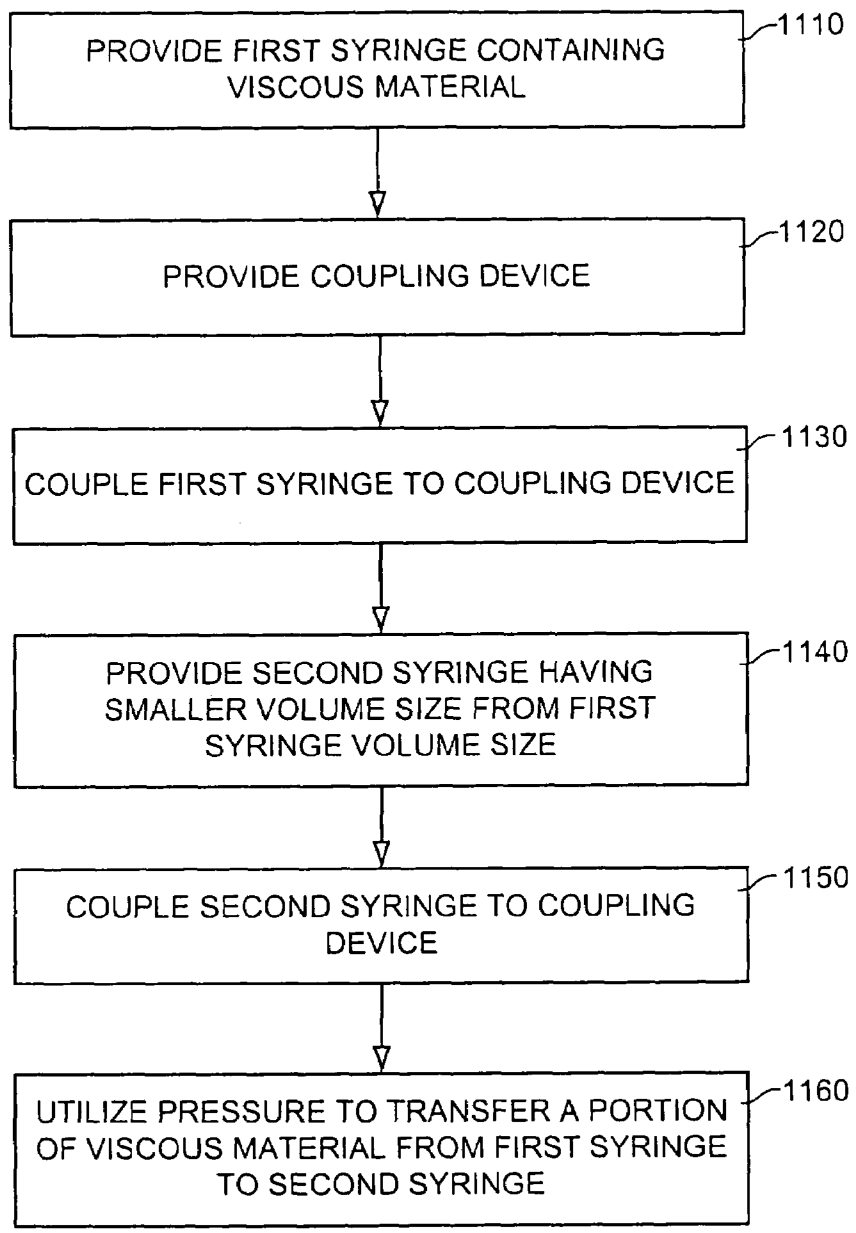
FIGS. 11*a* and 11*b* illustrate a flow chart for a method of transferring viscous material according to one embodiment of the invention.
Figure 11B:
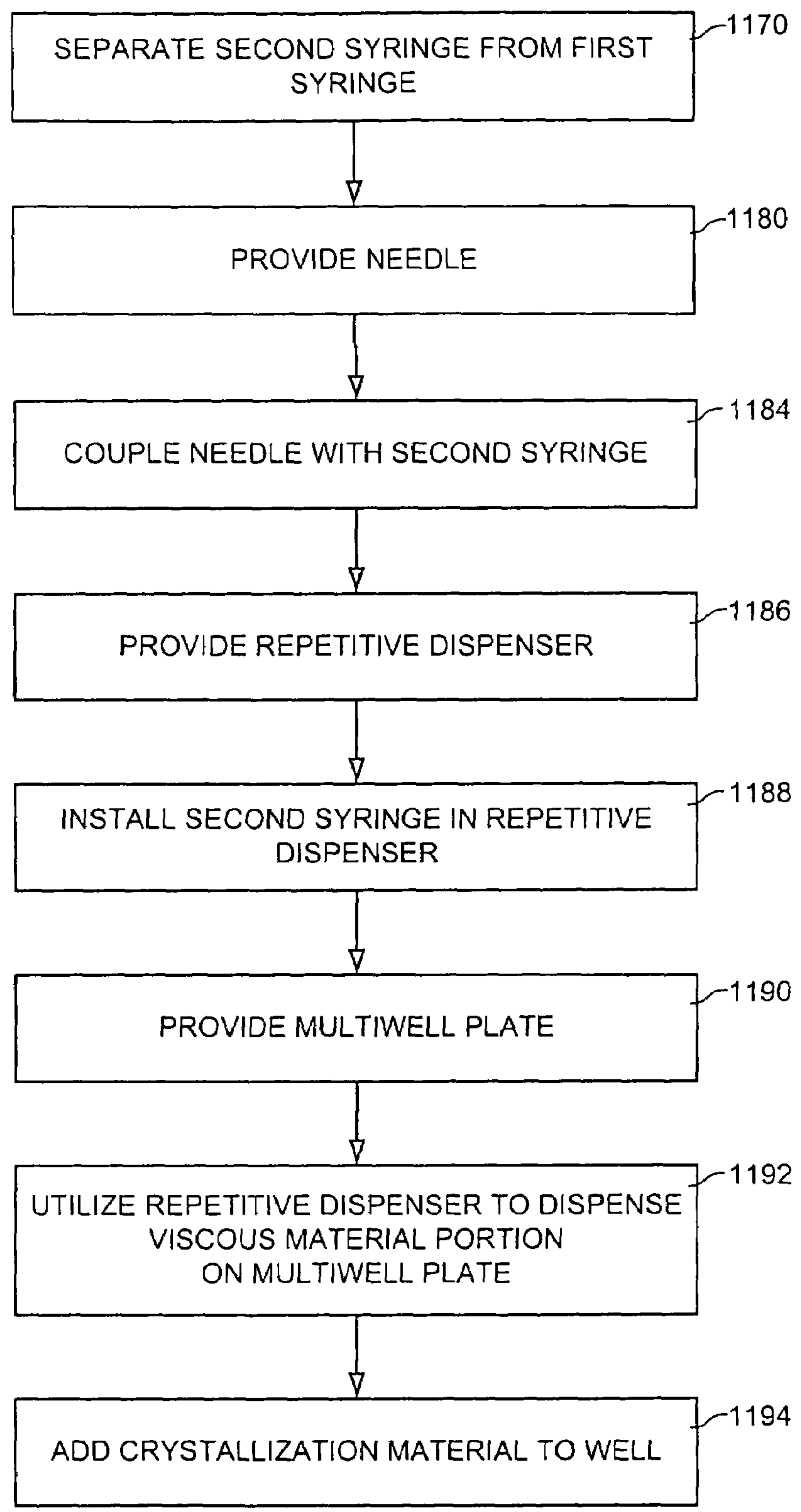

Similarly, FIGS. 11*a* and 11*b* illustrate a method 1100 for transferring and dispensing viscous material, such as LCP material. In block 1110 a first syringe is provided containing LCP material. A coupling device is provided in block 1120 and this coupling device is coupled to the first syringe utilizing a receptacle on the coupling as illustrated in block 1130. In block 1140 a second syringe is provided having a smaller volume size from that of the first syringe. This second syringe is also coupled to the coupling device, for example, with a receptacle of the coupling device. Then, pressure can be utilized to transfer a portion of the viscous material from the first syringe to the second syringe as noted in block 1160.

After the viscous material is transferred from the first syringe to the second syringe, the second syringe can be separated from the first syringe as shown in block 1170. A needle can then be provided as shown in block 1180. The needle and second syringe can then be coupled with one another as illustrated in block 1184. A repetitive dispenser can then be provided in which the second syringe can be installed as shown in blocks 1186 and 1188, respectively. A multiwell plate is then provided as shown in block 1190 and the repetitive dispenser can then be used to dispense viscous material portion onto the multiwell plate, as shown in block 1192. Furthermore, crystallization promoting material can be added as shown in block 1194. It is not necessary that the viscous material be dispensed on the multiwell plate prior to dispensing the crystallization promoting material; rather, they could be dispensed in any order.

In another embodiment of the invention, the assorted pieces of apparatus can be provided in a kit format so as to facilitate the mixing and dispensing of a viscous material such as LCP. Thus, the various elements described above could be provided as a kit in any unassembled combination.

While the various embodiments have been described with reference to 250 microliter and 10 microliter syringes, it would also be possible to use other sizes in their place. Furthermore, while a syringe has been used to describe the invention it should be understood that other devices could be used as well. Therefore, it should be understood that a syringe is intended to encompass any volumetric measuring device having a closed chamber that can be used to transfer viscous material, such as LCP, as described above.

It is thought that the apparatuses and methods of the embodiments of the present invention and many of its attendant advantages will be understood from this specification and it will be apparent that various changes may be made in the form, construction, and arrangement of the parts thereof without departing from the spirit and scope of the invention or sacrificing all of its material advantages, the form herein before described being merely exemplary embodiments thereof.

What is claimed is:

1. A method of mixing a LCP comprising:

providing a first syringe having a syringe barrel;

depositing a lipid material in said syringe barrel;

utilizing a second syringe to add protein material to said first syringe barrel;

mixing said lipid material and said protein material in said first syringe barrel to form said LCP in said first syringe barrel.

2. A method of mixing a LCP comprising:

providing a first syringe having a syringe barrel;

depositing a lipid material in said syringe barrel;

adding protein material to said syringe barrel;

mixing said lipid material and said protein material in said syringe barrel to form said LCP in said syringe barrel; and transferring said protein material and said lipid material to said second syringe.

3. The method as described in claim 1 and further comprising:

dispensing said LCP material in a plurality of holding locations.

4. The method as described in claim 1 and wherein the holding locations comprise an array of wells in a well plate.

5. The method as described in claim 1 and further comprising:

dispensing said LCP material on a microwell array.

6. The method as described in claim 1 and further comprising:

dispensing said LCP material in a container;

adding crystallization promoting material to said container;

growing a protein crystal from said LCP material and said crystallization promoting material in said container.

7. A method of mixing a LCP comprising:

providing a first syringe having a syringe barrel;

depositing a lipid material in said syringe barrel;

adding protein material to said syringe barrel;

mixing said lipid material and said protein material in said syringe barrel to form said LCP in said syringe barrel;

dispensing said LCP material in a container;

adding crystallization promoting material to said container;

growing a protein crystal from said LCP material and said crystallization promoting material in said container; and drying said crystallization promoting material prior to said dispensing said LCP material in said container.

* * * * *

UNITED STATES PATENT AND TRADEMARK OFFICE

CERTIFICATE OF CORRECTION

PATENT NO. : 7,482,166 B2
APPLICATION NO. : 10/688010
DATED : January 27, 2009
INVENTOR(S) : Peter Nollert et al.

It is certified that error appears in the above-identified patent and that said Letters Patent is hereby corrected as shown below:

On the title page item [73]:

Assignee: The Regents of the University of California, San Francisco, CA (US)

should be corrected to read as follows:

Assignee: The Regents of the University of California, Oakland, CA (US)

Signed and Sealed this

Eleventh Day of August, 2009

David J. Kappos
*Director of the United States Patent and Trademark Office*